US00RE37179E

(19) United States
(12) Reissued Patent
Yamachika et al.

(10) Patent Number: US RE37,179 E
(45) Date of Reissued Patent: May 15, 2001

(54) RADIATION SENSITIVE RESIN COMPOSITION

(75) Inventors: Mikio Yamachika, Austin, TX (US); Eiichi Kobayashi; Akira Tsuji, both of Yokkaichi (JP); Toshiyuki Ota, Seoul (KR)

(73) Assignee: JSR Corporation, Tokyo (JP)

(21) Appl. No.: 09/420,604

(22) Filed: Oct. 21, 1999

Related U.S. Patent Documents

Reissue of:
(64) Patent No.: 5,679,495
Issued: Oct. 21, 1997
Appl. No.: 08/352,848
Filed: Dec. 2, 1994

(30) Foreign Application Priority Data

Dec. 3, 1993 (JP) ..... 5-339490
Oct. 7, 1994 (JP) ..... 6-270332

(51) Int. Cl.[7] ..... G03F 7/023
(52) U.S. Cl. ..... 430/191; 430/165; 430/192; 430/193; 430/270.1; 430/905; 430/909; 430/910
(58) Field of Search ..... 430/270.1, 191, 430/165, 192, 193, 905, 909, 910

(56) References Cited

U.S. PATENT DOCUMENTS 5,034,305 * 7/1991 Nguyen-Kim et al. ..... 430/270.1
5,064,746 * 11/1991 Schwalm ..... 430/270.1
5,073,474 * 12/1991 Schwalm et al. ..... 430/270.1
5,130,392 * 7/1992 Schwalm et al. ..... 430/270.1
5,252,427 * 10/1993 Bauer et al. ..... 430/270.1
5,346,803 * 9/1994 Crivello et al. ..... 430/270.1
5,350,660 * 9/1994 Urano et al. ..... 430/176
5,352,564 * 10/1994 Takeda et al. ..... 430/270.1
5,443,690 * 8/1995 Takechi et al. ..... 430/286.1
5,498,506 * 3/1996 Wengenroth et al. ..... 430/270.1
5,576,143 * 11/1996 Aoai et al. ..... 430/270.1
5,580,695 * 12/1996 Murata et al. ..... 430/270.1

FOREIGN PATENT DOCUMENTS 63-250642 * 10/1988 (JP) .
2-27660 * 6/1990 (JP) .
3-44290 * 7/1991 (JP) .
3-206458 * 9/1991 (JP) .
4-39665 * 2/1992 (JP) .
4-257259 * 9/1992 (JP) .
5-113667 5/1993 (JP) .
5-181279 * 7/1993 (JP) .

* cited by examiner

*Primary Examiner*—John S. Chu
(74) *Attorney, Agent, or Firm*—Piper Marbury Rudnick & Wolfe LLP; Steven B. Kelber

(57) ABSTRACT

A radiation sensitive resin composition which comprises (A) a polymer which becomes alkali-soluble in the presence of an acid and (B) a radiation sensitive acid generator which generates an acid upon irradiation with a radiation, said polymer (A) comprising two recurring units represented by the general formulas (1) and (2) and a recurring unit which acts to reduce the solubility of the polymer is an alkali developer after the irradiation:

(1)

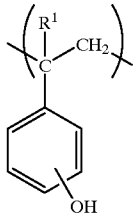

and (2)

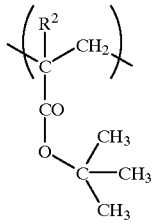

wherein $R^1$ represents a hydrogen atom or a methyl group and $R^2$ represents a hydrogen atom or a methyl group. Said composition provides a chemically amplified positive resist which can give a fine pattern with a good pattern shape, and said resist is freed from volume shrinkage, peeling failure and adhesive failure, is excellent in dry etching resistance and effectively reacts with various radiations to give a good pattern shape which is excellent in photolithographic process stability, said pattern shape having no thinned portion at the upper part.

57 Claims, No Drawings

RADIATION SENSITIVE RESIN COMPOSITION

Matter enclosed in heavy brackets [ ] appears in the original patent but forms no part of this reissue specification; matter printed in italics indicates the additions made by reissue.

BACKGROUND OF THE INVENTION

This invention relates to a radiation sensitive resin composition. More particularly, it relates to a radiation sensitive resin composition which can be used as a resist particularly suitable for fine processing using a radiation such as ultraviolet ray, deep ultraviolet ray, X ray or charged particle beam.

In the field of fine processing, a representative of which is the production of an integrated circuit device, a lithographic technique is now being developed which enables fine processing in the order of subhalfmicron to be effected with good reproducibility. Representative resists which have recently been used in the lithographic process include positive resists using an alkali-soluble resin such as a novolak resin or the like and a quinonediazide type radiation sensitive compound. However, the performance of these resists approaches its limit and the use thereof in the fine processing in the order of subhalfmicron is accompanied by a great difficulty.

That is to say, these negative and positive resists have heretofore had such a problem that a sufficient theoretical focal depth cannot be achieved when a fine pattern of 0.35 γm or less is intended to be formed by a lithographic technique using an ultraviolet ray such as g ray (wavelength: 436 nm) or i ray (wavelength: 365 nm) or the like from a mercury vapor lamp.

Under such circumstances, research has been energetically conducted on a lithographic process using deep ultraviolet rays, X rays or electron beams which can achieve a broader depth of focus in the formation of a fine pattern. However, conventional resists have various problems in respects of pattern shape, sensitivity, contrast, development and the like when deep ultraviolet rays, X rays or electron beams are used. That is to say, in the case of deep ultraviolet rays, the light absorption of the resist is too great, and hence, in the case of a negative resist, the pattern shape tends to become a so-called reverse taper shape in which the lower part of the pattern is narrower than the upper part, while even in the case of a positive resist, the pattern shape becomes a taper shape and the sensitivity and contrast and the like are also lowered. In the case of a higher energy radiation such as X ray and electron beam, in general, the lowering of sensitivity is greater than in the case of deep ultraviolet ray, and particularly, in the case of a positive resist, such a phenomenon that the solubility in a developing solution is lowered upon irradiation with a radiation in some cases through the solubility should be originally increased upon irradiation.

On the other hand, as a next generation resist, attention is paid to a chemically amplified resist containing a radiation sensitive acid generator (namely, a compound generating an acid upon irradiation with a radiation), and this resist has such an advantage that the catalytic action of the acid generated increases the sensitivity to various radiations.

As those chemically amplified resists which show relatively good resist performance, there are known, for example, those containing a resin having a tert-butyl ester group or a tert-butoxycarbonyl group (for example, Japanese Patent Application Kokoku No. 2-27,660), those containing a resin having a silyl group (for example, Japanese Patent Application Kokai No. 3-44,290), those containing a resin having an acrylic acid component (for example, Japanese Patent Application Kokai No. 4-39,665) and the like. However, it has ben pointed out that these chemically amplified resists have the respective inherent problems and various difficulties accompany the putting them to practical use. That is to say, in the system in which a resin having a tert-butyl ester group or a tert-butoxycarbonyl group is used, the chemical reaction based on the catalytic action of the acid generated is accompanied by the liberation of a gas component such as an isobutene gas or a carbon dioxide gas, so that the volume shrinkage is caused upon irradiation with a radiation, and consequently, the pattern shape tends to be distorted and hence the formation of a high precision pattern is difficult. The system in which a resin having a silyl group is used has a good pattern-formability; however, it has such a disadvantage that as compared with other systems using a resin free from silyl group, it is inferior in peelability from a substrate. In addition, in the system in which a resin comprising an acrylic acid component is used, there is such a disadvantage that the adhesiveness between the resist and the silicon substrate is insufficient, and there is such a problem that the dry etching resistance is lower than that of a resist using an aromatic resin.

In order to solve the above-mentioned problems, attention has recently been paid to resins having both acrylic acid ester structure and phenol skeleton (see, for example, Japanese Patent Application Kokai Nos. 4-251,259; 5-181,279 and 5-113,667).

Resists using these resins have such advantages that the dry etching resistance is improved as compared with that of a resin having only an acrylic acid recurring unit. However, since a carboxylic acid is formed in the exposed portion, the solubility-in-alkali-developer rate becomes too high, and there is such a disadvantage that when a resist pattern is actually formed on a substrate, the upper part of the pattern formed becomes too thin to form an ideally rectangular pattern.

SUMMARY OF THE INVENTION

It is an object of this invention to provide a radiation sensitive resin composition freed from the above-mentioned problems.

It is a further object of this invention to provide a radiation sensitive resin composition which is free from volume shrinkage, peeling failure and adhesive failure, can form a high precision pattern and has high dry etching resistance.

It is a still further object of this invention to provide a radiation sensitive resin composition excellent as a resist which can effectively decompose upon irradiation with various radiations to form a pattern which is excellent in photolithographic process stability and has the rectangular shape whose upper part is not thinned.

It is another object of this invention to provide a radiation sensitive resin composition excellent in pattern shape, sensitivity, contrast, developability and the like particularly when it is irradiated with deep ultraviolet rays, X rays or electron beams.

Other objects and advantages of this invention will become apparent from the following description.

According to this invention, there is provided a radiation sensitive resin composition which comprises (A) a polymer which becomes alkali-soluble in the presence of an acid and (B) a radiation sensitive acid generator which generates an acid upon irradiation with a radiation, said polymer (A) comprising two recurring units represented by the general formulas (1) and (2) and a recurring unit which acts to reduce the solubility of the polymer of the irradiated portion in an alkali developer after irradiation with a radiation:

(1)

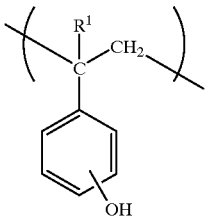

(2)

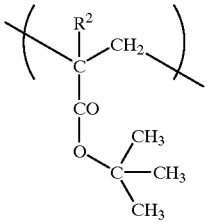

wherein $R^1$ represents a hydrogen atom or a methyl group and $R^2$ represents a hydrogen atom or a methyl group.

DETAILED DESCRIPTION OF THE INVENTION

Polymer (A)

The polymer (A) is a polymer having a recurring unit represented by the general formula (1) (referred to hereinafter as the recurring unit A), a recurring unit represented by the general formula (2) (referred to hereinafter as the recurring unit B) and a recurring unit which acts to reduce the solubility of the polymer of the irradiated portion in an alkali developer after irradiation with a radiation (referred to hereinafter as the recurring unit C):

(1)

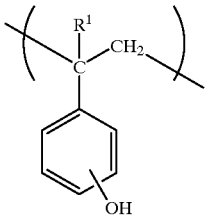

(2)

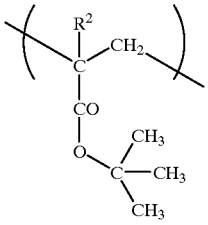

wherein $R^1$ represents a hydrogen atom or a methyl group and $R^2$ represents a hydrogen atom or a methyl group.

In the general formula (1), $R^1$ is either hydrogen atom or methyl group and the polymer (A) can have both the recurring unit of formula (1) in which $R^1$ is a hydrogen atom and the recurring unit of formula (1) in which $R^1$ is a methyl group. The proportion of the number of the recurring units A is preferably 5 to 75%, more preferably 20 to 70%, based on the total number of all the recurring units contained in the polymer (A). When the proportion of the recurring unit A is less than 5%, the adhesiveness to a substrate is inferior and there is a possibility of the resist pattern to peel, and when the proportion is more than 75%, the difference between the solubility-in-alkali-developer rate of the irradiated portion and that of the unirradiated portion becomes small and hence the resolution has a tendency to reduce.

In the general formula (2), $R^2$ is either a hydrogen atom or a methyl group and the polymer (A) can have both the recurring unit of formula (2) in which $R^2$ is a hydrogen atom and the recurring unit of formula (2) in which $R^2$ is a methyl group. The proportion of the number of the recurring units B is preferably 10 to 70%, more preferably 20 to 50%, based on the total number of all the recurring units in the polymer (A). When the proportion of the recurring unit B is less than 10%, the solubility-in-alkali-developer rate of the irradiated portion becomes so low that no pattern is formed. On the other hand, when the proportion of the recurring unit B is more than 70%, the amount of the benzene ring in the polymer (A) becomes insufficient and hence the dry etching resistance has a tendency to lower.

The recurring unit C is introduced by copolymerization into the polymer (A) in order to improve the pattern shape and resolution performance, and the proportion of the number of the recurring units C can vary depending upon the proportions of the recurring units A and B; however, it is preferably 0.5 to 50%, more preferably 1 to 30%, based on the total number of all the recurring units contained in the polymer (A). When the proportion of the recurring unit C is less than 0.5%, its effect on reducing the solubility-in-alkali-developer rate of the irradiated portion is lacking, so that the upper part of the resist pattern tends to become thinned, while when the proportion is more than 50%, the solubility-in-alkali-developer rate becomes so low that the sensitivity of the resist has a tendency to reduce.

The polymer (A) can be produced by radical polymerization, thermal polymerization or the like of the respective monomers corresponding to the recurring unit A, the recurring unit B and the recurring unit C. The monomer corresponding to the recurring unit A (referred to hereinafter as the monomer a) is vinylphenol or α-isopropenylphenol, the monomer corresponding to the recurring unit B (referred to hereinafter as the monomer b) is tert-butyl acrylate or tert-butyl methacrylate, and the monomer corresponding to the recurring unit C (referred to hereinafter as the monomer c) is a monomer having a low solubility in the alkali developer, that is, a monomer free from an acidic substituent such as sulfonic acid group, carboxyl group, phenolic hydroxyl group or the like.

Said monomer c includes organic compounds having a carbon—carbon double bond copolymerizable with the monomer a and the monomer b and having no said acidic substituent, and examples of the organic compounds include vinyl group-containing compounds, (meth)acryloyl group-containing compounds and the like.

Specific examples of the vinyl group-containing compounds as the monomer c include aromatic alkenyl compounds such as styrene, α-methylstyrene, p-methylstyrene, chlorostyrene and the like; hetero atom-containing aromatic vinyl compounds such as vinylpyridine and the like; vinyl ester compounds such as vinyl acetate and the like; vinyl ketone compound such as methyl vinyl ketone, ethyl vinyl ketone and the like; vinyl ether compounds such as methyl vinyl ether, ethyl vinyl ether and the like; hetero atom-containing alicyclic vinyl compounds such as vinylpyrrolidone, vinyl lactam and the like. Specific examples of the (meth)acryloyl group-containing compound which is one of the monomers c include methyl (meth) acrylate, ethyl (meth)acrylate, propyl(meth)acrylate, (meth) acrylamide, (meth)acrylonitrile and the like.

The polystyrene-reduced weight-average molecular weight of the polymer (A) (referred to hereinafter as Mw) is preferably 1,500 to 300,000, more preferably 3,000 to 100,000 from the viewpoint of retaining the sensitivity, heat resistance, developability and resolving power.

Moreover, the ratio of the polystyrene-reduced weight-average molecular weight Mw of the polymer (A) to the polystyrene-reduced number-average molecular weight (referred to hereinafter as Mn) of the polymer (A) [the ratio is referred to hereinafter as Mw/Mn] is preferably 1 to 5, more preferably 1.5 to 3.5 from the viewpoint of retaining the sensitivity, heat resistance, developability and resolving power.

As the polymer (A), there may be used a mixed polymer consisting of at least two polymer mixtures selected from a mixture of the polymers different in the proportions of the monomer a, the monomer b and the monomer c copolymerized in the above-mentioned range and a mixture of the polymers different in Mw and/or Mw/Mn in the above-mentioned ranges. Even when the mixed polymer is used as the polymer (A), it is preferable that the proportions of the monomer a, the monomer b and the monomer c copolymerized in the mixed polymer, Mw and/or Mw/Mn fall within the above-mentioned ranges.

Radiation Sensitive Acid Generator (B)

The radiation sensitive acid generator (B) used in this invention, namely, the compound which generates an acid upon irradiation with a radiation includes, for example, onium salt compounds, halogen-containing compounds, sulfone compounds, sulfonate compounds and quinonediazide compounds. More specifically, the following compounds are included:

(I) Onium salt compound

Iodonium salts, sulfonium salts, phosphonium salts, diazonium salts, pyridinium salts and the like are included. Preferable are diphenyliodonium triflate, diphenyliodonium pyrenesulfonate, diphenyliodonium dodecylbenzenesulfonate, triphenylsulfonium triflate, triphenylsulfoniumhexafluoroantimonate, diphenyliodonium hexafluoroantimonate, triphenylsulfoniumnaphthalenesulfonate, (hydroxyphenyl) benzylmethylsulfonium toluenesulfonate and the like.

Particularly preferable are triphenylsulfonium triflate, diphenyliodoniumhexafluoroantimonate and the like.

(II) Halogen-containing compound

Haloalkyl group-containing heterocyclic compounds, haloalkyl group-containing hydrocarbon compounds and the like are included. Preferable are (trichloromethyl)-s-triazine derivatives such as phenyl-bis(trichloromethyl)-s-triazine, methoxyphenyl-bis(trichloromethyl)-s-triazine, naphthyl-bis(trichloromethyl)-s-triazine and the like; 1,1-bis(4-chlorophenyl)-2,2,2-trichloroethane; and the like.

(III) Sulfone compound

β-ketosulfone, β-sulfonylsulfone and their α-diazo compounds thereof and the like. Preferable are phenacylphenylsulfone, mesitylphenacylsulfone, bis (phenylsulfonyl)methane, bis(phenylsulfonyl)diazomethane and the like.

(IV) Sulfonate compound

Alkylsulfonic acid esters, haloalkylsulfonic acid esters, arylsulfonic acid esters, iminosulfonates, imidosulfonates and the like are included.

Preferable imidosulfonate compounds are, for example, N-(trifluoromethylsulfonyloxy)succinimide, N-(trifluoromethylsulfonyloxy)phthalimide, N-(trifluoromethylsulfonyloxy)naphthylimide, N-(trifluoromethylsulfonyloxy)diphenylmaleimide, N-(trifluoromethylsulfonyloxy)-bicyclo-[2,2,1]-hept-5-ene-2,3-dicarboximide, N-(trifluoromethylsulfonyloxy)-7-oxabicyclo-[2,2,1]-hept-5-ene-2,3-dicarboximide, N-(trifluoromethylsulfonyloxy)-bicyclo-[2,2,1]-heptan-5,6-oxy-2,3-dicarboximide, N-(camphanylsulfonyloxy) succinimide, N-(camphanylsulfonyloxy)phthalimide, N-(camphanylsulfonyloxy)naphthylimide, N-(camphanylsulfonyloxy)diphenylmaleimide, N-(camphanylsulfonyloxy)bicyclo-[2,2,1]-hept-5-ene-2,3-dicarboximide, N-(camphanylsulfonyloxy)-7-oxabicyclo-[2,2,1]-hept-5-ene-2,3-dicarboximide, N-(camphanylsulfonyloxy)-bicyclo-[2,2,1]-heptan-5,6-oxy-2,3-dicarboximide, N-(4-methylphenylsulfonyloxy) succinimide, N-(4-methylphenylsulfonyloxy)phthalimide, N-(4-methylphenylsulfonyloxy)naphthylimide, N-(4-methylphenylsulfonyloxy)diphenylmaleimide, N-(4-methylphenylsulfonyloxy)-bicyclo-[2,2,1]-hept-5-ene-2,3-dicarboximide, N-(4-methylphenylsulfonyloxy)-7-oxabicyclo-[2,2,1]-hept-5-ene-2,3-dicarboximide, N-(4-methylphenylsulfonyloxy)-bicyclo-[2,2,1]-heptan-5,6-oxy-2,3-dicarboximide, N-(2-trifluoromethylphenylsulfonyloxy) succinimide, N-(2-trifluoromethylphenylsulfonyloxy) phthalimide, N-(2-trifluoromethylphenylsulfonyloxy) naphthylimide, N-(2-trifluoromethylphenylsulfonyloxy) diphenylmaleimide, N-(2-trifluoromethylphenylsulfonyloxy)bicyclo-[2,2,1]-hept-5-ene-2,3-dicarboximide, N-(2-trifluoromethylphenylsulfonyloxy)-7-oxabicyclo-[2,2,1]-hept-5-ene-2,3-dicarboximide, N-(2-trifluoromethylphenylsulfonyloxy)-bicyclo-[2,2,1]-heptan-5,6-oxy-2,3-dicarboximide and the like.

As other sulfonate compounds than the imidosulfonate compounds, preferable are, for example, benzoin tosylate, pyrogallol tristriflate, pyrogallolmethanesulfonic acid triester, nitrobenzyl-9,10-diethoxyanthracene-2-sulfonate and the like.

In the radiation sensitive resin composition of this invention, particularly preferably sulfonate compounds include pyrogallolmethanesulfonic acid triester, N-(trifluoromethylsulfonyloxy)-bicyclo-[2,2,1]-hept-5-ene-2,3-dicarboximide, N-(camphanylsulfonyloxy) naphthylimide, N-(2-trifluoromethylphenylsulfonyloxy) phthalimide, N-(trifluoromethylsulfonyloxy)-bicyclo-[2,2,1]-hept-5-ene-2,3-dicarboximide, N-(camphanylsulfonyloxy)naphthylimide, N-(2-trifluoromethylphenylsulfonyloxy)phthalimide and the like.

(V) Quinonediazide compound 1,2-Quinonediazidesulfonic acid ester compounds of polyhydroxy compounds are included. Preferable are compounds having a 1,2-quinonediazidesulfonyl group such as 1,2-benzoquinonediazide-4-sulfonyl group, 1,2-naphthoquinonediazide-4-sulfonyl group, 1,2-naphthoquinonediazide-5-sulfonyl group, a 1,2-naphthoquinonediazide-6-sulfonyl group or the like. Particularly preferable are compounds having a 1,2-naphthoquinonediazide-4-sulfonyl group or a 1,2-naphthoquinonediazide-5-sulfonyl group; and like compounds.

Specifically, the following compounds are mentioned:

1,2-Quinonediazidesulfonic acid esters of (poly) hydroxyphenyl aryl ketones such as 2,3,4-trihydroxybenzophenone, 2,4,6-trihydroxybenzophenone, 2,3,4,4'-tetrahydroxybenzophenone, 2,2',3,4-tetrahydroxybenzophenone, 3'-methoxy-2,3,4,4'-tetrahydroxybenzophenone, 2,2',4,4'-tetrahydroxybenzophenone, 2,2',3,4,4'-pentahydroxybenzophenone, 2,2',3,4,6'-pentahydroxybenzophenone, 2,3,3',4,4',5'-hexahydroxybenzophenone, 2,3',4,4',5',6-hexahydroxybenzophenone and the like;

1,2-quinonediazidesulfonic acid esters of bis-[(poly) hydroxyphenyl]alkanes such as bis(4-hydroxyphenyl) methane, bis(2,4-dihydroxyphenyl)methane, bis(2,3,4-trihydroxyphenyl)methane, 2,2-bis(4-hydroxyphenyl) propane, 2,2-bis(2,4-dihydroxyphenyl)propane, 2,2-bis-(2,3,4-trihydroxyphenyl)propane and the like;

1,2-quinonediazidesulfonic acid esters of (poly) hydroxyphenylalkanes such as 4,4'-dihydroxytriphenylmethane, 4,4',4"-trihydroxytriphenylmethane, 2,2',5,5'-tetramethyl-2",4,4'-trihydroxytriphenylmethane, 3,3',5,5'-tetramethyl-2",4,4'-trihydroxytriphenylmethane, 4,4',5,5'-tetramethyl-2,2',2"-trihydroxytriphenylmethane, 2,2',5,5'-tetramethyl-4,4',4"-trihydroxytriphenylmethane, 1,1,1-tris(4-hydroxyphenyl) ethane, 1,1-bis(4-hydroxyphenyl)-1-phenylethane, 1,1-bis (4-hydroxyphenyl)-1-(4'-[1-(4-hydroxyphenyl)-1-methylethyl]phenyl)ethane and the like;

1,2-quinonediazidesulfonic acid esters of (poly) hydroxyphenylflavans such as 2,4,4-trimethyl-2',4',7-trihydroxy-2-phenylflavan, 2,4,4-trimethyl-2',4',5',6,7-pentahydroxy-2-phenylflavan and the like.

Particularly preferable are 1,2-naphthoquinonediazide-4-sulfonic acid ester compounds of 1,1-bis(4-hydroxyphenyl)-1-(4'-[1-(4-hydroxyphenyl)-1-methylethyl]phenyl)ethanes represented by the following structural formula (3):

(3)

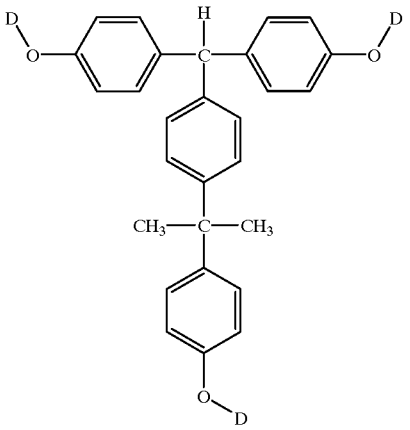

wherein D represents a substituent of the formula (4):

(4)

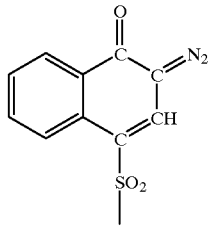

or a hydrogen atom.

In the formula (3), the proportion of D being a substituent of the formula (4) is preferably 75 to 95% on average, particularly preferably 80 to 90% on average.

These radiation sensitive acid generators (B) may be used alone or in admixture of two or more.

The amount of the radiation sensitive acid generator (B) used is preferably 0.05 to 20 parts by weight, more preferably 0.1 to 15 parts by weight, per 100 parts by weight of the polymer (A). When the amount of the radiation sensitive acid generator (B) used is less than 0.05 part by weight, it is difficult in some cases to cause chemical reaction effectively with an acid catalyst generated by irradiation with a radiation. On the other hand, when the amount of the radiation sensitive acid generator is more than 20 parts by weight, there is a fear that uneven coating is caused when the composition is applied to a substrate and scum and the like are formed during development.

Into the radiation sensitive resin composition of this invention may be incorporated, if necessary, an alkali-solubility controller, an acid-diffusion controller or the like as explained below.

Alkali-Solubility Controller

The alkali-solubility controller is a compound which has such properties that the alkali-solubility of the radiation sensitive resin composition is controlled, and when it is decomposed, for example, is hydrolyzed, in the presence of an acid, the alkali-solubility-controlling effect of the alkali-solubility controller on the radiation sensitive resin composition is reduced or lost, or the alkali-solubility of the radiation sensitive resin composition is accelerated by the controller after decomposition.

As such an alkali-solubility controller, there may be mentioned, for example, compounds whose acidic functional groups such as phenolic hydroxyl group, carboxyl group and the like have been substituted by acid-decomposable groups.

The alkali-solubility controller may be either a low molecular weight compound or a high molecular weight compound, and preferable controllers are compounds obtained by substituting an acid-decomposable group for the acidic functional group of polyphenol compounds having two or more phenolic hydroxy groups, such as bisphenol A, bisphenol F, bisphenol S and the like, and carboxylic acid compounds such as hydroxyphenylacetic acid and the like.

Specifically, compounds represented by the following structural formulas (a) and (b) are included:

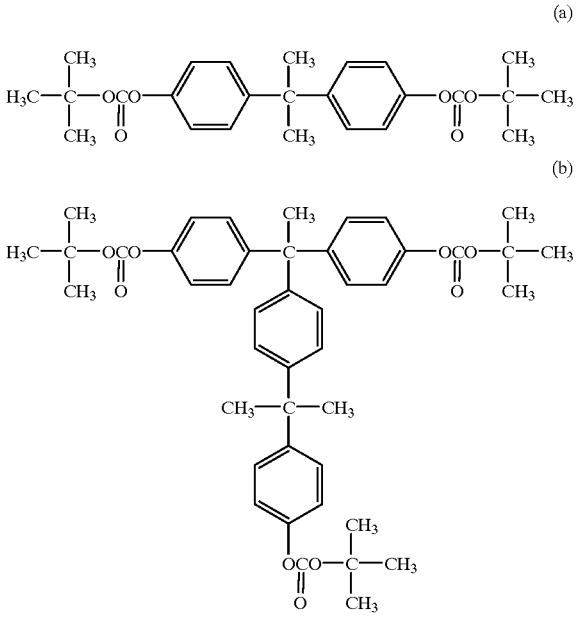

Also, as the high molecular eight alkali-solubility controller, there may be used an acid-decomposable group-containing resin.

The term "acid-decomposable group" used herein means a substituent which is decomposed in the presence of an acid to make the compound or resin, the acidic functional groups of which have been substituted by the acid decomposable groups, alkali-soluble.

Such acid-decomposable groups include, for example, substituted methyl groups, 1-substituted ethyl groups, 1-branched alkyl groups, allyl groups, germyl groups, alkoxycarbonyl groups, acyl groups, cyclic acid-decomposable groups and the like.

The above-mentioned substituted methyl groups include, for example, methoxymethyl group, methylthiomethyl group, ethoxymethyl group, ethylthiomethyl group, methoxyethoxymethyl group, benzyloxymethyl group, benzylthiomethyl group, phenacyl group, bromophenacyl group, methoxyphenacyl group, (methylthio)phenacyl group, cyclopropylmethyl group, benzyl group, diphenylmethyl group, triphenylmethyl group, bromobenzyl group, nitrobenzyl group, methoxybenzyl group, methylthiobenzyl group, ethoxybenzyl group, ethylthiobenzyl group, piperonyl group and the like.

The above-mentioned 1-substituted ethyl groups include, for example, 1-methoxyethyl group, 1-methylethyl group, 1,1-dimethoxyethyl group, 1-ethoxyethyl group, 1-ethylthioethyl group, 1,1-diethoyxethyl group, 1-phenoxyethyl group, 1-phenylthioethyl group, 1,1-diphenoxyethyl group, 1-benzyloxyethyl group, 1-benzylthioethyl group, 1-cyclopropylethyl group, 1-phenylethyl group, 1,1-diphenylethyl group, α-methylphenacyl group and the like.

The above-mentioned 1-branched alkyl groups include, for example, isopropyl group, sec-butyl group, tert-butyl group, 1,1-dimethylpropyl group, 1-methylbutyl group, 1,1-dimethylbutyl group and the like.

The above-mentioned silyl groups include, for example, trimethylsilyl group, ethyldimethylsilyl group, diethylmethylsilyl group, triethylsilyl group, dimethylisopropylsilyl group, methyldiisopropylsilyl group, tri-isopropylsilyl group, tert-butyldimethylsilyl group, di-tert-butylmethylsilyl group, tri-tert-butylsilyl group, dimethylphenylsilyl group, methyldiphenylsilyl group, triphenylsilyl group and the like.

The above-mentioned germyl groups include, for example, trimethylgermyl group, ethyldimethylgermyl group, diethylmethylgermyl group, triethylgermyl group, dimethylisopropylgermyl group, methyldiisopropylgermyl group, triisopropylgermyl group, tert-butyldimethylgermyl group, di-tert-butylmethylgermyl group, tri-tert-butylgermyl group, dimethylphenylgermyl group, methyldiphenylgermyl group, triphenylgermyl group and the like.

The above-mentioned alkoxycarbonyl groups include, for example, methoxycarbonyl group, ethoxycarbonyl group, isopropoxycarbonyl group, tert-butoxycarbonyl group, tert-pentyloxycarbonyl group and the like.

The above-mentioned acyl groups include, for example, acetyl group, propionyl group, butyryl group, heptanoyl group, hexanoyl group, valeryl group, pivoloyl group, isovaleryl group, lauloyl group, myristoyl group, palmitoyl group, stearoyl group, oxalyl group, malonyl group, succinyl group, glutaryl group, adipoyl group, piperoyl group, suberoyl group, azelaoyl group, sebacoyl group, acryloyl group, propioloyl group, methacryloyl group, crotonoyl group, oleoyl group, maleoyl group, fumaroyl group, mesaconoyl group, camphoroyl group, benzoyl group, phthaloyl group, isophthaloyl group, terephthaloyl group, naphthoyl group, toluoyl group, hydroatropoyl group, atropoyl group, cinnamoyl group, furoyl group, thenoyl group, nicotinoyl group, isonicotinoyl group, toluenesulfonyl group, mesyl group and the like.

The above-mentioned cyclic acid-decomposable groups include, for example, cyclopropyl group, cyclopentel group, cyclohexyl group, cyclohexenyl group, oxocyclohexenyl group, 4-methoxycyclohexyl group, tetrahydropyranyl group, tetrahydrofuranyl group, tetrahydrothiopyranyl group, tetrahydrothiofuranyl group, 3-bromotetrahydropyranyl group, 4-methoxytetrahydropyranyl group, 4-methoxytetrahydrothiopyranyl group, 3-tetrahydrothiophene-1,1-dioxide group, 2-1,3-dioxolanyl group, 2-1,3-dithioxolanyl group, benzo-2-1,3-dioxolanyl group, benzo-2-1,3-dioxolanyl group and the like.

Among these acid-decomposable groups, preferable are tert-butyl group, benzyl group, tert-butoxycarbonyl group, tert-butoxycarbonylmethyl group, tertrahydropyranyl group, tetrahydrofuranyl group, tetrahydrothiopyranyl group, tetrahydrothiofuranyl group and trimethylsilyl group and the like.

The above-mentioned acid-decomposable group-containing resin can be produced, for example, by introducing at least one acid-decomposable group into an alkali-soluble resin or polymerizing or copolymerizing at least one monomer having at least one acid-decomposable group or polycondensing or copolycondensing at least one polycondensing component having at least one acid-decomposable group.

Incidentally, the proportion of the acid-decomposable group introduced into the acid-decomposable group-containing resin (the ratio of the number of acid-decomposable groups to the total number of acidic functional groups and acid-decomposable groups in the acid-decomposable group-containing resin) is preferably 15 to 100%, more preferably 15 to 80% and most preferably 15 to 60%.

The Mw of the acid-decomposable group-containing resin is preferably 1,000 to 150,000, more preferably 3,000 to 100,000.

These acid-decomposable group-containing resins may be used alone or in admixture of two or more.

The proportion of the alkali-solubility controller added in this invention is preferably 100 parts by weight or less per 100 parts by weight of the polymer (A). When the amount of the alkali-solubility controller is more than 100 parts by weight, the coatability of the composition, coating-film strength and the like have a tendency to reduce.

The alkali-solubility controller may be used alone or in admixture of two or more in each case of a low molecular weight compound or a high molecular weight compound (namely, the acid-decomposable group-containing resin) and a mixture of the low molecular weight compound and the high molecular weight compound may also be used.

Acid-Diffusion Controller

The acid-diffusion controller has such an action as to control the diffusion phenomenon in the resist coating-film of the acid generated from the acid generator by irradiation with a radiation and control the undesirable chemical reactions in the unirradiated area. When the acid-diffusion controller is used, the pattern shape, particularly the degree of formation of a visor in the upper part of the pattern ("T"-shape), the dimension fidelity to mask dimension and the like can be further improved.

Such acid-diffusion controllers are preferably nitrogen-containing organic compounds whose basicity is not changed by irradiation with a radiation or heating, and specific examples thereof include ammonia, hexylamine, heptylamine, octylamine, nonylamine, decylamine, dibutylamine, dipentylamine, dihexylamine, diheptylamine, dioctylamine, dinonylamine, didecylamine, trimethylamine, triethylamine, tripropylamine, tributylamine, tripentylamine, trihexylamine, triheptylamine, trioctylamine, trinonylamine, tridecylamine, aniline, N-methylaniline, N,N-dimethylaniline, 2-methylaniline, 3-methylaniline, 4-methylaniline, 4-nitroaniline, 1-naphthylamine, 2-naphthylamine, diphenylamine, ethylenediamine, tetramethylenediamine, hexamethylenediamine, pyrrolidone, piperidine, imidazole, 4-methylimidazole, 4-methyl-2-phenylimidazole, thiabendazole, pyridine, 2-methylpyridine, 4-methylpyridine, 2-ethylpyridine, 4-ethylpyridine, 1-methyl-4-phenylpyridine, 2-(1-ethylpropyl)pyridine, nicotinamide, dibenzoylthiamine, riboflavin tetrabutyrate, 4,4-diaminodiphenylmethane, 4,4'-diaminodiphenyl ether, 4,4,-diaminobenzophenone, 4,4,-diaminodiphenylamine, 2,2-bis(4-aminophenyl)propane, 2-(3-aminophenyl)-2-(4-aminophenyl)propane, 2-(4-aminophenyl)-2-(3-hydroxyphenyl)propane, 2-(4-aminophenyl)-2-(4-hydroxyphenyl)propane, 1,4-bis[1-(4-aminophenyl)-1-methylethyl]benzene, 1,3-bis[1-(4-aminophenyl)-1-methylethyl]benzene, dimethyl succinate-1-(2-hydroxyethyl)-4-hydroxy-2,2,6,6-tetramethylpiperidine polycondensate, poly[{6-(1,1,3,3-tetramethylbutyl)imino-1,3,5-triazine-2,4-diyl}{(2,2,6,6-tetramethyl-4-piperidyl)imino}hexamethylene{(2,2,6,6-tetramethyl-4-piperidyl)imino}], bis (1,2,2,6,6-pentamethyl-4-piperidyl)-2-(3,5-di-tert-butyl-4-hydroxybenzyl)-2-butylmalonate and the like.

These acid-diffusion controllers may be used alone or in admixture of two or more.

The proportion of the acid-diffusion controller added in this invention is preferably 0.001 to 10 parts by weight, more preferably 0.005 to 5 parts by weight, per 100 parts by weight of the polymer (A). In this case, when the amount of the acid-diffusion controller used is less than 0.001 part by weight, there is a fear that the pattern shape and dimension fidelity may not be improved under some processing conditions, and when the proportion is more than 10 parts by weight, the sensitivity as a resist and the developability in the exposed portion have a tendency to lower.

Various Additives

The radiation sensitive resin composition of this invention may, if necessary, contain various additives such as a surfactant, a sensitizer and the like.

The above surfactant has an action to improve the coatability of the radiation sensitive resin composition, striation, developability of coating-film of the composition and the like. Such surfactants include, for example, polyoxyethylene lauryl ether, polyoxyethylene stearyl ether, polyoxyethylene oleyl ether, polyoxyethylene octyl phenyl ether, polyoxyethylene nonyl phenyl ether, polyoxyethylene glycol dilaurate and polyoxyethylene glycol distearate and also include KP341 (a trade name of Shin-Ets Chemical Co., Ltd.), Polyflow No. 75, No. 95 (trade names of Kyoeisha Yushi Kagaku Kogyo K. K.), F Top EF301, EF303, EF352 (trade names of Tokem Products), Megafac F171, F172, F173 (trade names of DAINIPPON INK & CHEMICALS, INC.), Fluorad FC430, FC431 (trade names of Sumitomo 3M Limited), Asahi Guard AG710, Surflon S-382, SC-101, SC-102, SC-103, SC-104, SC-105, SC-106 (trade names of Asahi Glass Co., Ltd.) and the like.

The amount of the surfactant added is preferably 2 parts by weight or less per 100 parts by weight of the solid content of the radiation sensitive resin composition.

The above-mentioned sensitizer has an action to absorb the energy of radiation and transfer the energy to the radiation sensitive acid generator (B) to thereby increase the amount of acid produced and has also an effect that the sensitivity of resist obtained from the radiation sensitive resin composition of this invention is enhanced. The sensitizer is preferably a ketone, a benzene, an acetophenone, a benzophenone, a naphthalene, a biacetyl, an eocin, rose bengal, a pyrene, an anthracene, a phenolthiazine or the like.

The amount of the sensitizer added is preferably 50 parts by weight or less, more preferably 30 parts by weight or less, per 100 parts by weight of the solid content of the radiation sensitive resin composition.

By compounding a dye or pigment with the composition, the influence of halation during irradiation with a radiation can be softened and by compounding an adhesion promoters with the composition, the adhesion properties of the coating-film to a substrate can be improved.

Moreover, other additives include halation-preventing agents such as azo compounds, amine compounds and the like, storage stabilizers; defoaming agents; shape-improving agents; and the like.

Solvent

The radiation sensitive resin composition of this invention is dissolved in a solvent so that the solid concentration becomes, for example, 5 to 50% by weight, preferably 20 to 40% by weight when it is used, and then filtered through a filter having a pore diameter, for example, about 0.2$\mu$ to prepare a composition solution.

The solvent to be used in the preparation of the composition solution includes, for example, ethylene glycol monoalkyl ethers such as ethylene glycol monomethyl ether, ethylene glycol monoethyl ether, ethylene glycol monopropyl ether, ethylene glycol monobutyl ether and the like; ethylene glycol monoalkyl ether acetates such as ethylene glycol monomethyl ether acetate, ethylene glycol monoethyl ether acetate, ethylene glycol monopropyl ether acetate, ethylene glycol monobutyl ether acetate and the like; diethylene glycol dialkyl ethers such as diethylene glycol dimethyl ether, diethylene glycol diethyl ether, diethylene glycol dipropyl ether, diethylene glycol dibutyl ether and the like; propylene glycol monoalkyl ethers such as propylene glycol monomethyl ether, propylene glycol monoethyl ether, propylene glycol monopropyl ether, propylene glycol monobutyl ether and the like; propylene glycol dialkyl ethers such as propylene glycol dimethyl ether, propylene glycol diethyl ether, propylene glycol dipropyl ether, propylene glycol dibutyl ether and the like; propylene glycol monoalkyl ether acetates such as propylene glycol monomethylether acetate, propylene glycol monoethyl ether acetate, propylene glycol monopropyl ether acetate, propylene glycol monobutyl ether acetate and the like; lactic acid esters such as methyl lactate, ethyl lactate, n-propyl lactate, isopropyl lactate, n-butyl lactate, isobutyl lactate and the like; aliphatic carboxylic acid esters such as methyl formate, ethyl formate, n-propyl formate, isopropyl formate, n-butyl formate, isobutyl formate, n-amyl formate, isoamyl formate, methyl acetate, ethyl acetate, n-propyl acetate, isopropyl acetate, n-butyl acetate, isobutyl acetate, n-amyl acetate, isoamyl acetate, n-hexyl acetate, methyl propionate, ethyl propionate, n-propyl propionate, isopropyl propionate, n-butyl propionate, isobutyl propionate, methyl butyrate, ethyl butyrate, n-propyl butyrate, isopropyl butyrate, n-butyl butyrate, isobutyl butyrate and the like; other esters such as ethyl hydroxyacetate, ethyl 2-hydroxy-2-methylpropionate, methyl 3-methoxy-2-methylpropionate (methyl β-methoxybutyrate), methyl, 2-hydroxy-3-methylbutyrate, ethyl methoxyacetate, ethyl ethoxyacetate, methyl 3-methoxypropionate, ethyl 3-methoxypropionate, methyl 3-ethoxypropionate, ethyl 3-ethoxypropionate, 3-methoxybutyl acetate, 3-methyl-3-methoxybutyl acetate, 3-methyl-3-methoxybutyl propionate, 3-methyl-3-methoxybutyl butyrate, methyl acetoacetate, ethyl acetoacetate, methyl pyruvate, ethyl pyruvate and the like; aromatic hydrocarbons such as toluene, xylene and the like; ketones such as methyl ethyl ketone, 2-heptanone, 3-heptanone, 4-heptanone, cyclohexanone and the like; amides such as N-methylformamide, N,N-dimethylformamide, N-methylacetamide, N,N-dimethylacetamide, N-methylpyrrolidone and the like; lactones such as γ-butyrolactone and the like; etc.

These solvents may be used alone or in admixture of two or more.

The amount of the solvent used in the composition solution in this invention is preferably 20 to 3,000 parts by weight, more preferably 50 to 3,000 parts by weight, and most preferably 100 to 2,000 parts by weight, per 100 parts by weight of the total solid content of the polymer (A), the radiation sensitive acid generator (B) and the optionally added dissolution controller and/or additives.

In the formation of a resist pattern from the radiation sensitive resin composition of this invention, the composition solution is applied to a substrate such as a silicon wafer, an aluminum-coated wafer or the like by a means such as a spin coating, a flow coating, a roll coating or the like to form a resist coating-film, and the resist coating-film is irradiated with a radiation so that the desired pattern is formed. The radiation used in this case is appropriately selected from ultraviolet rays such as i ray and the like; deep ultraviolet rays such as excimer laser and the like; X rays such as synchrotron radiation or the like; and charged particle beams such as electron beam and the like depending upon the kind of the radiation sensitive acid generator (B) used. The irradiation conditions such as irradiation dose and the like are appropriately selected depending upon the compounding recipe of the radiation sensitive resin composition, the kind of the additives and the like.

In the formation of a resist pattern using the radiation sensitive resin composition of this invention, it is possible to provide a protective coating-film on the resist coating-film for preventing the influence of basic impurities or the like contained in the working atmosphere.

In this invention, in order to enhance the apparent sensitivity of the resist coating-film, it is preferable to effect baking after the irradiation (post-exposure baking). The heating conditions for the post-exposure baking may be varied depending upon the compounding recipe of the radiation sensitive resin composition of this invention, the kind of additives and the like; however, the heating temperature is preferably 30° to 200° C., more preferably 50° to 150° C.

Subsequently, the irradiated resist coating-film is developed with an alkali developer to form the desired resist pattern. The alkali developer includes, for example, alkaline compounds such as sodium hydroxide, potassium hydroxide, sodium carbonate, sodium silicate, sodium metasilicate, ammonia water, ethylamine, n-propylamine, diethylamine, di-n-propylamine, triethylamine, methyldiethylamine, dimethylethanolamine, triethanolamine, tetramethylammonium hydroxide, tetraethylammonium hydroxide, choline, pyrrole, piperidine, 1,8-diazabicyclo-[5,4,0]-7-undecene, 1,5-diazabicyclo-[4,3,0]-5-nonene and the like, and an aqueous alkaline solution having a concentration of preferably 1 to 10% by weight, more preferably 2 to 5% by weight is used as the developer.

To the above developer may be added an aqueous organic solvent such as methanol, ethanol or the like and a surfactant in appropriate amounts.

Incidentally, when a developer consisting of such an aqueous alkaline solution is used, the resulting resist pattern is washed with water after the development.

The positive radiation sensitive resin composition of this invention can form a highly precise pattern without causing volume shrinkage, peeling failure and adhesive failure and is excellent in dry etching resistance.

Moreover, the positive radiation sensitive resin composition of this invention reacts effectively with various radiations, is excellent in photolithographic process stability and, in particular, the upper part of the pattern shape formed does not become thinner than the lower part and a rectangular pattern can be formed.

Furthermore, the positive radiation sensitive resin composition of this invention is excellent in pattern shape, sensitivity, contrast, developability and the like particularly when deep ultraviolet rays, X rays or electron beams are used.

DESCRIPTION OF THE PREFERRED EMBODIMENTS

This invention is explained in more detail below referring to Examples and Comparative Examples; however, this invention should not be construed to be limited thereto.

In the Examples, various characteristics were evaluated as follows.

Mw and Mw/Mn

Using a GPC column manufactured by TOSOH CORP. (two $G2000H_{XL}$ columns, one $G3000H_{XL}$ column and one $G4000H_{XL}$ column), the Mw was measured by a gel permeation chromatograph method in which a monodisperse standard polystyrene was used as a standard under the analysis conditions that the flow rate was 1.0 ml/min, the eluent was tetrahydrofuran, and the column temperature was 40° C.

Optimum Dose of Radiation Irradiated

After irradiation with various radiation doses, like mentioned above, then the development with a 2.38% by weight aqueous tetrahydroammonium hydroxide solution, water-washing and drying were conducted to form a resist pattern on a silicon wafer with the irradiated-resist coating film. And then the radiation dose necessary for forming a 0.5-μm line-and-space pattern (1L1S) in a 1:1 width was determined as the optimum radiation dose.

Resolution

The minimum dimension of the resist pattern resolved when a radiation was irradiated at the optimum radiation dose was determined as the resolution.

Pattern Shape

The lower side dimension La and the upper side dimension Lb of the square cross-section of the 1L1S pattern of a line width of 0.5 μm formed on a silicon wafer were measured using a scanning type electron microscope. When the resulting pattern satisfied $0.85 \leqq Lb/La \leqq 1$ and the pattern had no thinned portion in the vicinity of the substrate and no overhang at the top (no "T"-shape), said pattern shape was determined good. When patterns did not satisfy these conditions, they were determined bad.

Process Stability

An irradiation was applied to a resist coating-film formed on a silicon wafer and, immediately thereafter, the resist coating-film was subjected to post exposure baking and development to obtain a resist pattern. Separately, the resist coating-film irradiated with a radiation was allowed to stand for two hours after the irradiation and then subjected to post exposure baking and development to obtain another resist pattern. The shapes of the two resist patterns obtained were compared.

Synthesis Example 1

In 50 g of dioxane were dissolved 20 g of vinylphenol, 20 g of tert-butyl acrylate and 8.5 g of styrene, and then 8.2 g of 2,2'-azobisisobutyronitrile was added thereto, after which the resulting solution was bubbled with a nitrogen gas for 30 minutes. Thereafter, the solution was heated to 60° C. while the bubbling was continued to effect polymerization for seven hours. After the polymerization, the solution was poured into a large amount of hexane to coagulate the polymer and the polymer was then recovered. The polymer was dissolved in acetone and then the resulting solution was poured into hexane again to coagulate the polymer. This operation was repeated several times to remove completely the unreacted monomers, after which the polymer was dried at 50° C. under vacuum overnight. The polymer thus obtained was white and the yield was 55%. As a result of $^{1}$H-NMR and $^{13}$C-NMR analyses, it was found that the composition of the polymer was such that vinylphenol, tert-butyl acrylate and styrene were copolymerized at a proportion of approximately 2:2:1. Mw was 24,000 and Mw/Mn was 2.8. This polymer is referred to hereinafter as Polymer (I).

Synthesis Example 2

The same procedure as in Synthesis Example 1 was repeated, except that 22 g of isopropenylphenol was substituted for the 20 g of vinyphenol, to synthesize a polymer. The polymer obtained was white and the yield was 45%. As a result of $^{1}$H-NMR and $^{13}$C-NMR analyses, it was found that the composition of the polymer was such that isopropenylphenol, tert-butyl acrylate and styrene were copolymerized at a ratio of approximately 2:3:1. Mw was 28,000 and Mw/Mn was 2.6. This polymer is referred to hereinafter as Polymer (II).

Synthesis Example 3

The same procedure as in Synthesis Example 1 was repeated, except that 15 g of tert-butyl methacrylate was substituted for the 20 g of tert-butyl acrylate and 3 g of methyl methacrylate was substituted for the 8.5 g of styrene, to synthesize a polymer. The polymer obtained was white and the yield was 60%. As a result of $^{1}$H-NMR and $^{13}$C-NMR analyses, it was found that the composition of the polymer was such that vinylphenol, tert-butyl methacrylate and methyl methacrylate were copolymerized at a ratio of approximately 5:3:1. Mw was 22,000 and Mw/Mn was 2.7. This polymer is referred to hereinafter as Polymer (III).

Synthesis Example 4

The same procedure as in Synthesis Example 3 was repeated, except that 1.2 g of acrylonitrile was substituted for the 3 g of methyl methacrylate, to synthesize a polymer. The polymer thus obtained was yellowish white and the yield was 55%. As a result of $^{1}$H-NMR and $^{13}$C-NMR analyses, it was found that the composition of the polymer was such that vinylphenol, tert-butyl methacrylate and acrylonitrile were copolymerized at a ratio of approximately 5:3:1. Mw was 29,000 and Mw/Mn was 2.4. This polymer is referred to hereinafter as Polymer (V).

Synthesis Example 5

In 59 g of propylene glycol monomethyl ether were dissolved 22 g of isopropenylphenol, 11 g of tert-butyl acrylate, 2 g of α-methylstyrene and 1 g of methyl vinyl ketone, and then, 2.5 g of benzoyl peroxide was added to the resulting solution, after which the solution was bubbled with a nitrogen gas for 30 minutes. Thereafter, the solution was heated to 80° C. while the bubbling was continued to effect polymerization for 48 hours. After the polymerization, the solution was poured into a large amount of hexane to coagulate a polymer. This polymer was dissolved in acetone and then coagulated in hexane again. This operation was repeated several times to remove the unreacted monomers completely and the polymer was dried at 50° C. under vacuum overnight. The polymer thus obtained was white and the yield was 55%. As a result of $^{1}$H-NMR and $^{13}$C-NMR analyses, it was found that the composition of the polymer was such that isopropenylphenol, tert-butyl acrylate, α-methylstyrene and methyl vinyl ketone were copolymerized at a ratio of approximately 13:7:2:1. Mw was 18,000 and Mw/Mn was 3.2. This polymer is referred to hereinafter as Polymer (V).

Synthesis Example 6

The same procedure as in Synthesis Example 5 was repeated, except that 10 g of vinylphenol, 12 g of isopropenylphenol, 10 g of tert-butyl methacrylate and 3 g of styrene were dissolved in 50 g of toluene, to produce a polymer. The polymer thus obtained was white and the yield was 55%. As a result of $^{1}$H-NMR and $^{13}$C-NMR analyses, it was found that the composition of the polymer was such that vinylphenol, isopropenylphenol, tert-butyl methacrylate and styrene were copolymerized at a ratio of approximately 4:3:3:1. Mw was 31,000 and Mw/Mn was 2.5. This polymer is referred to hereinafter as Polymer (VI).

Comparative Synthesis Example 1

In 50 ml of dioxane were dissolved 12 g of polyhydroxystyrene and 5 g of triethylamine. To this mixed solution was added 4 g of di-tert-butyl carbonate while the solution was stirred, and then stirred at room temperature for 6 hours, after which oxalic acid was added to the solution to neutralize the triethylamine. This solution was poured into a large amount of water to coagulate a polymer and the polymer was washed with pure water several times to obtain a white polymer. The yield was 85%. As a result of $^{1}$H-NMR and $^{13}$C-NMR analyses, it was found that the composition of the polymer was such that vinylphenol, and tert-butoxycarbonyloxyvinylphenol were copolymerized at a ratio of approximately 7:3. Mw was 9,200 and Mw/Mn was 2.8. This polymer is referred to hereinafter as Polymer (VII).

Comparative Synthesis Example 2

The same procedure as in Synthesis Example 1 was repeated, except that 24 g of vinylphenol and 19 g of tert-butyl methacrylate were dissolved in 50 g of dioxane, to produce a polymer. The polymer obtained was white and the yield was 65%. As a result of $^{1}$H-NMR and $^{13}$C-NMR analyses, it was found that the composition of the polymer was such that vinylphenol and tert-butyl methacrylate were copolymerized at a ratio of approximately 7:3. Mw was 23,000 and Mw/Mn was 2.3. This polymer is referred to hereinafter as Polymer (VIII).

Examples 1 to 16 and Comparative Examples 1 and 2

The polymer (A), the radiation sensitive acid generator (B) and optionally the dissolution controller, the acid-diffusion controller and the solvent shown in Table 1 were mixed in the proportion shown in Table 1 to form a uniform solution, and thereafter, the solution was filtered through a membrane filter having a pore diameter of 0.2 $\mu$m to prepare a resist solution.

The resist solution was coated on a silicon wafer by a spin coater and then prebaked at 90° C. for 100 seconds to form a resist coating-film having a film thickness of 1.0 $\mu$m, after which the resist coating-film was irradiated with the various radiations shown in Table 2 and thereafter subjected to post exposure baking at 90° C. for 120 seconds. Subsequently, the irradiated and baked resist coating-film was developed with 2.38% by weight aqueous tetramethylammonium hydroxide solution by a dipping method at 23° C. for 60 seconds, and then washed with water for 30 seconds. The results obtained are shown in Table 2.

TABLE 1

| | Polymer | | Acid generator | | Alkali-solubility controller | | Acid-diffusion controller | | Solvent | |
|---|---|---|---|---|---|---|---|---|---|---|
| | Kind | Part by wt. | Kind | Part by wt. | Kind | Part by wt. | Kind | Part by wt. | Kind | Part by wt. |
| Example | | | | | | | | | | |
| 1 | I | 100 | P1 | 3 | — | — | — | — | EL | 350 |
| 2 | I | 70 | P2 | 3 | D1 | 30 | — | — | EL/EEP | 200/100 |
| 3 | II | 100 | P3 | 5 | — | — | — | — | EL/BA | 200/100 |
| 4 | III | 100 | P1 | 3 | — | — | — | — | PGMEA | 300 |
| 5 | IV | 100 | P2 | 3 | — | — | — | — | MAX | 300 |
| 6 | V | 100 | P4 | 10 | — | — | — | — | MMP | 300 |
| 7 | VI | 80 | P1 | 3 | D2 | 20 | — | — | EL/MMP | 150/150 |
| 8 | I | 100 | P5 | 5 | — | — | — | — | EL | 350 |
| 9 | II | 70 | P6 | 3 | D1 | 30 | — | — | EL/EEP | 200/100 |
| 10 | II | 100 | P1/P5 | 3/2 | — | — | — | — | PGMEA | 300 |
| 11 | III | 100 | P7 | 3 | — | — | — | — | EL/BA | 200/100 |
| 12 | V | 100 | P5/P7 | 2/2 | — | — | — | — | MMP | 300 |
| 13 | I | 100 | P1 | 3 | — | — | C1 | 1.2 | EL | 350 |
| 14 | II | 100 | P3 | 5 | — | — | C3 | 2.0 | EL/BA | 200/100 |
| 15 | I | 100 | P5 | 5 | — | — | C4 | 2.0 | EL | 350 |
| 16 | II | 100 | P1/P5 | 3/2 | — | — | C2 | 1.2 | PGMEA | 300 |
| Comp. Ex. | | | | | | | | | | |
| 1 | VII | 100 | P1 | 3 | — | — | — | — | ECA | 300 |
| 2 | VIII | 100 | P2 | 3 | — | — | — | — | PGMEA | 300 |

TABLE 2

| | Radiation source | Optimum dose of radiation | Resolution | Pattern shape | Process stability |
|---|---|---|---|---|---|
| Example | | | | | |
| 1 | KrF excimer laser (248 nm) | 30 mJ/cm$^2$ | 0.25 $\mu$m | Good | Good |
| 2 | KrF excimer laser (248 nm) | 35 mJ/cm$^2$ | 0.25 $\mu$m | Good | Good |
| 3 | KrF excimer laser (248 nm) | 45 mJ/cm$^2$ | 0.25 $\mu$m | Good | Good |
| 4 | KrF excimer laser (248 nm) | 30 mJ/cm$^2$ | 0.25 $\mu$m | Good | Good |
| 5 | Electron beam (beam dia. 0.25 $\mu$m) | 3 $\mu$C/cm$^2$ | 0.25 $\mu$m | Good | Good |
| 6 | i ray (365 nm) | 180 msec | 0.35 $\mu$m | Good | Good |
| 7 | X ray (palladium L$\alpha$) $\mu$ = 0.347 nm | 100 mJ/cm$^2$ | 0.30 $\mu$m | Good | Good |
| 8 | Electron beam (beam dia. 0.25 $\mu$m) | 3 $\mu$C/cm$^2$ | 0.25 $\mu$m | Good | Good |
| 9 | KrF excimer laser (248 nm) | 45 mJ/cm$^2$ | 0.25 $\mu$m | Good | Good |
| 10 | KrF excimer laser (248 nm) | 30 mJ/cm$^2$ | 0.25 $\mu$m | Good | Good |
| 11 | KrF excimer laser (248 nm) | 40 mJ/cm$^2$ | 0.25 $\mu$m | Good | Good |
| 12 | KrF excimer laser (248 nm) | 35 mJ/cm$^2$ | 0.25 $\mu$m | Good | Good |
| 13 | KrF excimer laser (248 nm) | 35 mJ/cm$^2$ | 0.23 $\mu$m | Good | Good |
| 14 | KrF excimer laser (248 nm) | 50 mJ/cm$^2$ | 0.23 $\mu$m | Good | Good |
| 15 | KrF excimer laser (248 nm) | 40 mJ/cm$^2$ | 0.23 $\mu$m | Good | Good |
| 16 | KrF excimer laser (248 nm) | 35 mJ/cm$^2$ | 0.23 $\mu$m | Good | Good |
| Comp. Example | | | | | |
| 1 | KrF excimer laser (248 nm) | 20 mJ/cm$^2$ | 0.45 $\mu$m | Bad Overhang | Bad No pattern formed |
| 2 | KrF excimer laser (248 nm) | 15 mJ/cm$^2$ | 0.30 $\mu$m | Bad Upper part of pattern was thinned. | Bad Upper part of pattern was thinned. |

In Tables 1 and 2, the symbols used for the acid generator and solvent have the following meanings:

Radiation sensitive acid generator

P1: Triphenylsulfonium triflate

P2: Diphenyliodonium hexafluoroantimonate

P3: Pyrogallolmethanesulfonic acid triester

P4: Compound represented by the following structural formula (3):

(3)

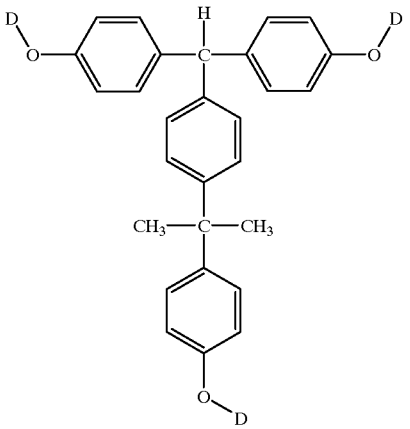

wherein D represents the substituent shown by the formula (4) or a hydrogen atom;

(4)

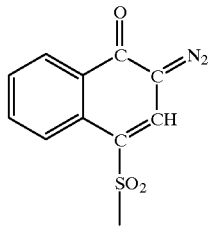

and 85% on average of D is the substituent shown by the formula (4) and 15% on average of D is a hydrogen atom.

P5: N-(Trifluoromethylsulfonyloxy)-bicyclo-[2,2,1]-hept-5-ene-2,3-dicarboximide

P6: N-(Camphanylsulfonyloxy)naphthylimide

P7: N-(2-Trifluoromethylphenylsulfonyloxy)phthalimide

Alkali-solubility controller

D1: Compound represented by the structural formula (d1):

(d1)

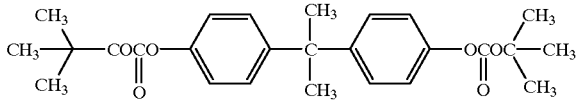

D2: Compound represented by the structural formula (d2):

(d2)

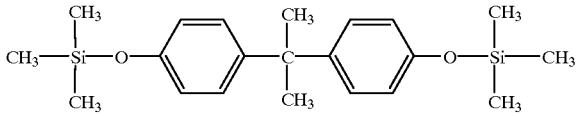

Acid-diffusion controller
C1: Tripropylamine
C2: Tri-n-butylamine
C3: Diaminodiphenylmethane
C4: Octylamine
Solvent
EL: Ethyl lactate
EEP: Ethyl 3-ethoxypropionate
MMP: Methyl 3-methoxypropionate
PGMEA: Propylene glycol monomethyl ether acetate
BA: Butyl acetate
MAK: Methyl amyl ketone
ECA: Ethyl Cellosolve acetate

What is claimed is:

1. A radiation sensitive resin composition which consists essentially of (A) a polymer which becomes alkali-soluble in the presence of an acid and (B) a radiation sensitive acid generator which generates an acid upon irradiation with a radiation, said polymer (A) comprising two recurring units A and B represented by the general formulas (1) and (2), respectively, and a recurring unit C which acts to reduce the solubility of the polymer in an alkali developer after the irradiation:

(1)

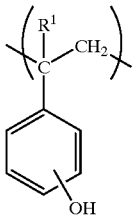

and (2)

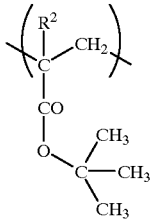

wherein $R^1$ represents a hydrogen atom or a methyl group and $R^2$ represents a hydrogen atom or a methyl group, and wherein the recurring unit C is derived from at least one organic compound which is free from any acidic substituent and selected from the group consisting of styrene, α-methylstyrene, p-methylstyrene, methyl (meth) acrylate, ethyl (meth) acrylate, propyl (meth) acrylate, (meth) acrylamide and (meth) arylonitrile.

2. The radiation sensitive resin composition according to claim 1, wherein the recurring unit represented by the general formula (1) corresponds to at least one monomer selected from the group consisting of vinylphenol and α-isopropenylphenol.

3. The radiation sensitive resin composition according to claim 1, wherein the recurring unit represented by the general formula (2) corresponds to at least one monomer selected from the group consisting of tert-butyl acrylate and tert-butyl methacrylate.

4. The radiation sensitive resin composition according to claim 1, wherein the polystyrene-reduced weight-average molecular-weight (Mw) of the polymer (A) is 1,500 to 300,000.

5. The radiation sensitive resin composition according to claim 1, wherein the polystyrene-reduced weight-average molecular-weight of the polymer (A) is 3,000 to 300,000.

6. The radiation sensitive resin composition according to claim 1, wherein the ratio of the polystyrene-reduced weight-average molecular-weight (Mw) of the polymer (A) to the polystyrene-reduced number-average molecular-weight (Mn) of the polymer (A) (Mw/Mn) is 1 to 5.

7. The radiation sensitive resin composition according to claim 6, wherein the ratio (Mw/Mn) is 1.5 to 3.5.

8. The radiation sensitive resin composition according to claim 1, wherein the proportion of the number of the recurring units represented by the general formula (1) in the polymer (A) is 5 to 75% of the total number of all the recurring units contained in the polymer (A).

9. The radiation sensitive resin composition according to claim 1, wherein the proportion of the number of the recurring units represented by the general formula (2) in the polymer (A) is 10 to 70% of the total number of all the recurring units contained in the polymer (A).

10. The radiation sensitive resin composition according to claim 1, wherein the proportion of the number of the recurring units which act to reduce the solubility of the polymer (A) in the alkali developer in the polymer (A) is 0.5 to 50% of the total number of all the recurring units contained in the polymer (A).

11. The radiation sensitive resin composition according to claim 1, wherein the radiation sensitive acid generator (B) is at least one compound selected from the group consisting of onium salts, halogen-containing compounds, sulfone compounds, sulfonate compounds and quinonediazide compounds.

12. The radiation sensitive resin composition according to claim 1, wherein the amount of the radiation sensitive acid generator (B) used is 0.05 to 20 parts by weight per 100 parts by weight of the polymer (A).

13. The radiation sensitive resin composition according to claim 1, wherein the amount of the radiation sensitive acid generator (B) used is 0.1 to 15 parts by weight per 100 parts by weight of the polymer (A).

14. The radiation sensitive resin composition according to claim 1, which further contains an alkali-solubility controller.

15. The radiation sensitive resin composition according to claim 14, wherein the alkali-solubility controller is a compound having an acidic functional group which has been substituted by an acid-decomposable group.

16. The radiation sensitive resin composition according to claim 1, which further contains an acid-diffusion controller.

17. The radiation sensitive resin composition according to claim 16, wherein the acid-diffusion controller is a nitrogen-containing compound whose basicity is not changed by irradiation or heating.

18. A radiation sensitive resin composition which consists essentially of (A) a polymer which becomes alkali-soluble in the presence of an acid and (B) a radiation sensitive acid generator which generates an acid upon irradiation with a radiation, said polymer (A) comprising two recurring units A and B represented by the general formulas (1) and (2) and a recurring unit C which acts to reduce the solubility of the polymer in an alkali developer after the irradiation:

(1)

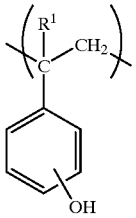

and (2)

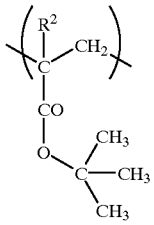

wherein $R^1$ represents a hydrogen atom or a methyl group and $R^2$ represents a hydrogen atom or a methyl group, and wherein the recurring unit C is derived from at least one organic compound which is free from any acidic substituent and selected from the group consisting of hetero atom-containing aromatic vinyl compounds, vinyl ketone compounds and hetero atom-containing alicyclic ring compounds.

19. The radiation sensitive resin composition according to claim 11, wherein the onium salt is at least one compound selected from the group consisting of diphenyliodonium triflate, diphenyliodonium pyrenesulfonate, diphenyliodonium dodecylbenzenesulfonate, triphenylsulfonium triflate, triphenylsulfonium hexafluoroantimonate, diphenyliodonium hexafluoroantimonate, triphenylsulfonium naphthalenesulfonate, (hydroxyphenyl) benzylmethylsulfonium toluenesulfonate.

20. The radiation sensitive resin composition according to claim 1, wherein the ratio of the polystyrene-reduced weight-average molecular weight (Mw) of the polymer (A) to the polystyrene-reduced number average molecular weight (Mn) of the polymer (A) is 1 to 5.

21. The radiation sensitive resin composition according to claim 1, which further contains an alkali-solubility controller.

22. The radiation sensitive resin composition according to claim 1, which further contains an acid-diffusion controller.

23. The radiation sensitive resin composition according to claim 18, which further contains an alkali-solubility controller.

24. The radiation sensitive resin composition according to claim 18, which further contains an acid-diffusion controller.

*25. A radiation sensitive resin composition which comprises (A) a polymer which becomes alkali-soluble in the presence of an acid and (B) a radiation sensitive acid generator which generates an acid upon irradiation with a radiation, said polymer (A) comprising two recurring units A and B represented by the general formulas (1) and (2), respectively, and a recurring unit C which acts to reduce the solubility of the polymer in an alkali developer after the irradiation:*

(1)

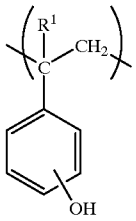

and (2)

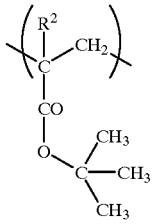

*wherein $R^1$ represents a hydrogen atom or a methyl group and $R^2$ represents a hydrogen atom or a methyl group, and wherein the recurring unit C is derived from at least one organic compound which is free from any acidic substituent and selected from the group consisting of styrene, alpha-methylstyrene, p-methylstyrene, methyl (meth) acrylate, ethyl (meth) acrylate, propyl (meth) acrylate, (meth) acrylamide and (meth) arylonitrile.*

*26. The radiation sensitive resin composition according to claim 25, wherein the recurring unit represented by the general formula (1) corresponds to at least one monomer selected from the group consisting of vinylphenol and alpha-isopropenylphenol.*

*27. The radiation sensitive resin composition according to claim 25, wherein the recurring unit represented by the general formula (2) corresponds to at least one monomer selected from the group consisting of tert-butyl acrylate and tert-butyl methacrylate.*

*28. The radiation sensitive resin composition according to claim 25, wherein the polystyrene-reduced weight-average molecular-weight (Mw) of the polymer (A) is 1,500 to 300,000.*

*29. The radiation sensitive resin composition according to claim 25, wherein the polystyrene-reduced weight-average molecular-weight of the polymer (A) is 3,000 to 300,000.*

*30. The radiation sensitive resin composition according to claim 25, wherein the ratio of the polystyrene-reduced weight-average molecular-weight (Mw) of the polymer (A) to the polystyrene-reduced number-average molecular-weight (Mn) of the polymer (A) (Mw/Mn) is 1 to 5.*

*31. The radiation sensitive resin composition according to claim 30, wherein the ratio (Mw/Mn) is 1.5 to 3.5.*

*32. The radiation sensitive resin composition according to claim 25, wherein the proportion of the number of the recurring units represented by the general formula (1) in the polymer (A) is 5 to 75% of the total number of all the recurring units contained in the polymer (A).*

*33. The radiation sensitive resin composition according to claim 25, wherein the proportion of the number of the recurring units represented by the general formula (2) in the polymer (A) is 10 to 70% of the total number of all the recurring units contained in the polymer (A).*

*34. The radiation sensitive resin composition according to claim 25, wherein the proportion of the number of the recurring units which act to reduce the solubility of the polymer (A) in the alkali developer in the polymer (A) is 0.5*

*to 50% of the total number of all the recurring units contained in the polymer (A).*

*35. The radiation sensitive resin composition according to claim 25, wherein the radiation sensitive acid generator (B) is at least one compound selected from the group consisting of onium salts, halogen-containing compounds, sulfone compounds, sulfonate compounds and quinonediazide compounds.*

*36. The radiation sensitive resin composition according to claim 25, wherein the amount of the radiation sensitive acid generator (B) used is 0.05 to 20 parts by weight per 100 parts by weight of the polymer (A).*

*37. The radiation sensitive resin composition according to claim 25, wherein the amount of the radiation sensitive acid generator (B) used is 0.1 to 15 parts by weight per 100 parts by weight of the polymer (A).*

*38. The radiation sensitive resin composition according to claim 25, which further contains an alkali-solubility controller.*

*39. The radiation sensitive resin composition according to claim 38, wherein the alkali-solubility controller is a compound having an acidic functional group which has been substituted by an acid-decomposable group.*

*40. The radiation sensitive resin composition according to claim 25, which further contains an acid-diffusion controller.*

*41. The radiation sensitive resin composition according to claim 40, wherein the acid-diffusion controller is a nitrogen-containing compound whose basicity is not changed by irradiation or heating.*

*42. A radiation sensitive resin composition which comprises (A) a polymer which becomes alkali-soluble in the presence of an acid and (B) a radiation sensitive acid generator which generates an acid upon irradiation with a radiation, said polymer (A) comprising two recurring units A and B represented by the general formulas (1) and (2) and a recurring unit C which acts to reduce the solubility of the polymer in an alkali developer after the irradiation:*

(1)

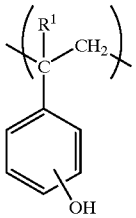

and (2)

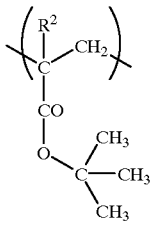

*wherein $R^1$ represents a hydrogen atom or a methyl group and $R^2$ represents a hydrogen atom or a methyl group, and wherein the recurring unit C is derived from at least one organic compound which is free from any acidic substituent and selected from the group consisting of hetero atom-containing aromatic vinyl compounds, vinyl ketone compounds and hetero atom-containing alicyclic ring compounds.*

*43. The radiation sensitive resin composition according to claim 35, wherein the onium salt is at least one compound selected from the group consisting of diphenyliodonium triflate, diphenyliodonium pyrenesulfonate, diphenyliodonium dodecylbenzenesulfonate, triphenylsulfonium triflate, triphenylsulfonium hexafluoroantimonate, diphenyliodonium hexafluoroantimonate, triphenylsulfonium naphthalenesulfonate, (hydroxyphenyl) benzylmethylsulfonium toluenesulfonate.*

*44. The radiation sensitive resin composition according to claim 25, wherein the ratio of the polystyrene-reduced weight-average molecular weight (Mw) of the polymer (A) to the polystyrene-reduced number average molecular weight (Mn) of the polymer (A) is 1 to 5.*

*45. The radiation sensitive resin composition according to claim 25, which further contains an alkali-solubility controller.*

*46. The radiation sensitive resin composition according to claim 25, which further contains an acid-diffusion controller.*

*47. The radiation sensitive resin composition according to claim 42, which further contains an alkali-solubility controller.*

*48. The radiation sensitive resin composition according to claim 42, which further contains an acid-diffusion controller.*

*49. The composition of claim 1, wherein said composition further consists essentially of a solvent.*

*50. The composition of claim 49, wherein said composition further consists essentially of a surfactant.*

*51. The composition of claim 49, wherein said composition further consists essentially of a sensitizer.*

*52. The composition of claim 51, wherein said sensitizer is added in amount of no more than fifty parts by weight, per one hundred parts by weight of solid content of said radiation sensitive resin composition.*

*53. The composition of claim 50, wherein said surfactant is present in amounts of no more than two parts by weight per one hundred parts by weight of solid content of said radiation sensitive resin composition.*

*54. The composition of claim 49, wherein said composition further consists essentially of a dye or pigment.*

*55. The composition of claim 49, wherein said composition further consists essentially of an adhesion promoter.*

*56. The composition of claim 49, wherein said composition further consists essentially of at least one additive selected from the group consisting of a halation-preventing agent, a storage stabilizer, a defoaming agent and a shape-improving agent.*

*57. The composition of claim 49, wherein said solvent comprises ethyl lactate.*

* * * * *

UNITED STATES PATENT AND TRADEMARK OFFICE

CERTIFICATE OF CORRECTION

PATENT NO. : RE 37,179 E
DATED : May 15, 2001
INVENTOR(S) : Yamachika et al.

It is certified that error appears in the above-identified patent and that said Letters Patent is hereby corrected as shown below:

Title page,
Item [56], FOREIGN PATENT DOCUMENTS, the sixth reference "4-257259" should read -- 4-251259 --.

Column 16,
Line 44, "(V)" should read -- (IV) --.

Column 26,
Line 49, after "or" and before "pigment", insert -- a --;

Signed and Sealed this

Ninth Day of July, 2002

*Attest:*

*Attesting Officer*

JAMES E. ROGAN
*Director of the United States Patent and Trademark Office*